US010622035B1

(12) United States Patent
Yu et al.

(10) Patent No.: US 10,622,035 B1
(45) Date of Patent: Apr. 14, 2020

(54) SENSE AMPLIFIER, SENSING METHOD AND NON-VOLATILE MEMORY USING THE SAME

(71) Applicant: Taiwan Semiconductor Manufacturing Co., Ltd., Hsinchu (TW)

(72) Inventors: Hung-Chang Yu, Hsin-chu (TW); Ta-Ching Yeh, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/234,580

(22) Filed: Dec. 28, 2018

Related U.S. Application Data

(60) Provisional application No. 62/737,903, filed on Sep. 27, 2018.

(51) Int. Cl.
*G11C 7/00* (2006.01)
*G11C 7/06* (2006.01)
*G11C 7/08* (2006.01)
*G11C 27/02* (2006.01)

(52) U.S. Cl.
CPC .............. *G11C 7/065* (2013.01); *G11C 7/08* (2013.01); *G11C 27/026* (2013.01)

(58) Field of Classification Search
CPC ...................................................... G11C 7/065
USPC .......................................................... 365/205
See application file for complete search history.

(56) References Cited

U.S. PATENT DOCUMENTS

2006/0044907 A1* 3/2006 Forbes .................. G11C 7/062
365/207
2017/0040045 A1* 2/2017 Piccardi ............... G11C 13/004

* cited by examiner

*Primary Examiner* — Hoai V Ho
(74) *Attorney, Agent, or Firm* — JCIPRNET (57) ABSTRACT

A sense amplifier includes a first sample and hold circuit, a second sample and hold circuit, a latch-type amplifier. The first sample and hold circuit is coupled to a bit line and configured to sample and hold memory cell data during a pre-charge phase of a sensing operation. The second sample and hold circuit is coupled to a reference bit line and configured to sample and hold data of a reference memory cell data during the pre-charge phase of the sensing operation. The latch-type amplifier, coupled to the first sample and hold circuit and the second sample and hold circuit, and configured to compare the memory cell data and the reference cell data during an evaluation phase of the sensing operation to output a sensing signal. The sense amplifier is isolated from the bit line and the reference bit line during the evaluation phase of the sensing operation. A sensing method adapted to a sense amplifier and a non-volatile memory include a sense amplifier are also introduced.

20 Claims, 5 Drawing Sheets

FIG. 5

SENSE AMPLIFIER, SENSING METHOD AND NON-VOLATILE MEMORY USING THE SAME

CROSS-REFERENCE TO RELATED APPLICATION

This application claims the priority benefit of U.S. provisional application Ser. No. 62/737,903, filed on Sep. 27, 2018. The entirety of the above-mentioned patent application is hereby incorporated by reference herein and made a part of this specification.

BACKGROUND

A sense amplifier is an essential component for a sensing operation of a memory. Bit line load has impacts on pre-charge phase of the sensing operation. Particularly, larger bit line load will not only cause longer sensing time and hence longer read access time but also cause more power consumption for charging the bit line. Besides, considering process variation and temperature effect, the sensing margin for a sense amplifier sometimes is too small so that read error rate becomes larger.

Therefore, it is desirable to have a sense amplifier that has capabilities of eliminating or reducing the impact of bit line load on the sensing operation of the sense amplifier and increasing the sensing margin to reduce the error rate of the sensing operation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
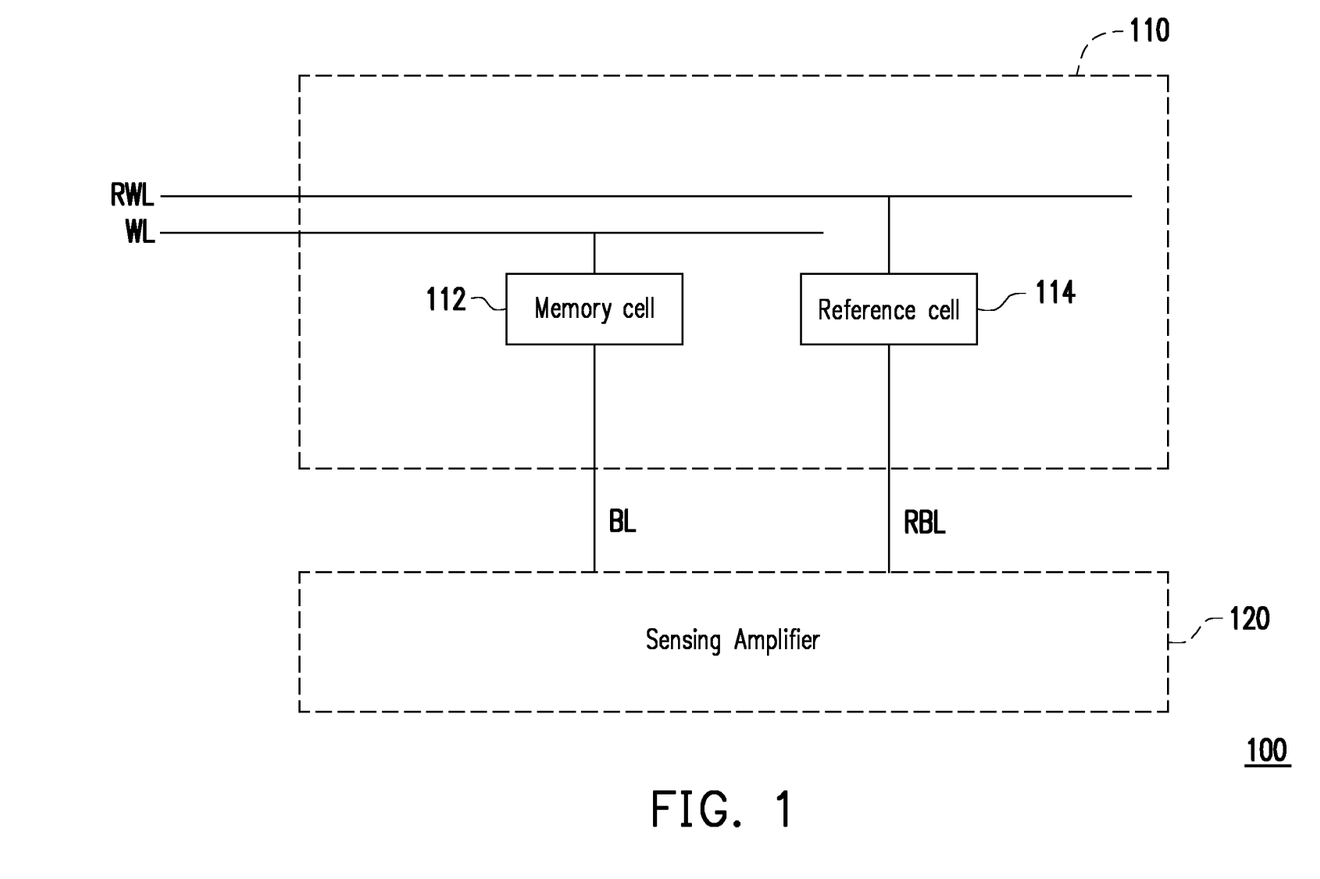
FIG. 1 illustrates a schematic diagram of non-volatile memory having a sense amplifier according to an embodiment of the present disclosure.

Referring to FIG. 1, a non-volatile memory 100 includes a memory array 110 and a sense amplifier 120. The memory array 110 includes a plurality of memory cells located in an intersection area between word lines and bit lines. The memory array 110 may further include at least one reference memory cell. The memory cells of the memory array 110 include a memory cell 112 coupled to a bit line BL and a word line WL, and the reference memory cell 114 coupled to a reference word line RWL and a reference bit line RBL. The sense amplifier 120 is coupled to the memory cell 112 and the reference memory cell 114 via the bit line BL and the reference bit line RBL, respectively.

The sense amplifier 120 is configured to perform a read operation or a sensing operation to sense the value of data stored in the memory cell 112. For example, the sense amplifier 120 may compare the data stored in the memory cell 112 with a reference value (e.g., the reference data of the reference memory cell 114) to output a sensing signal which indicate the value of data stored in the memory cell 112.

Figure 2:
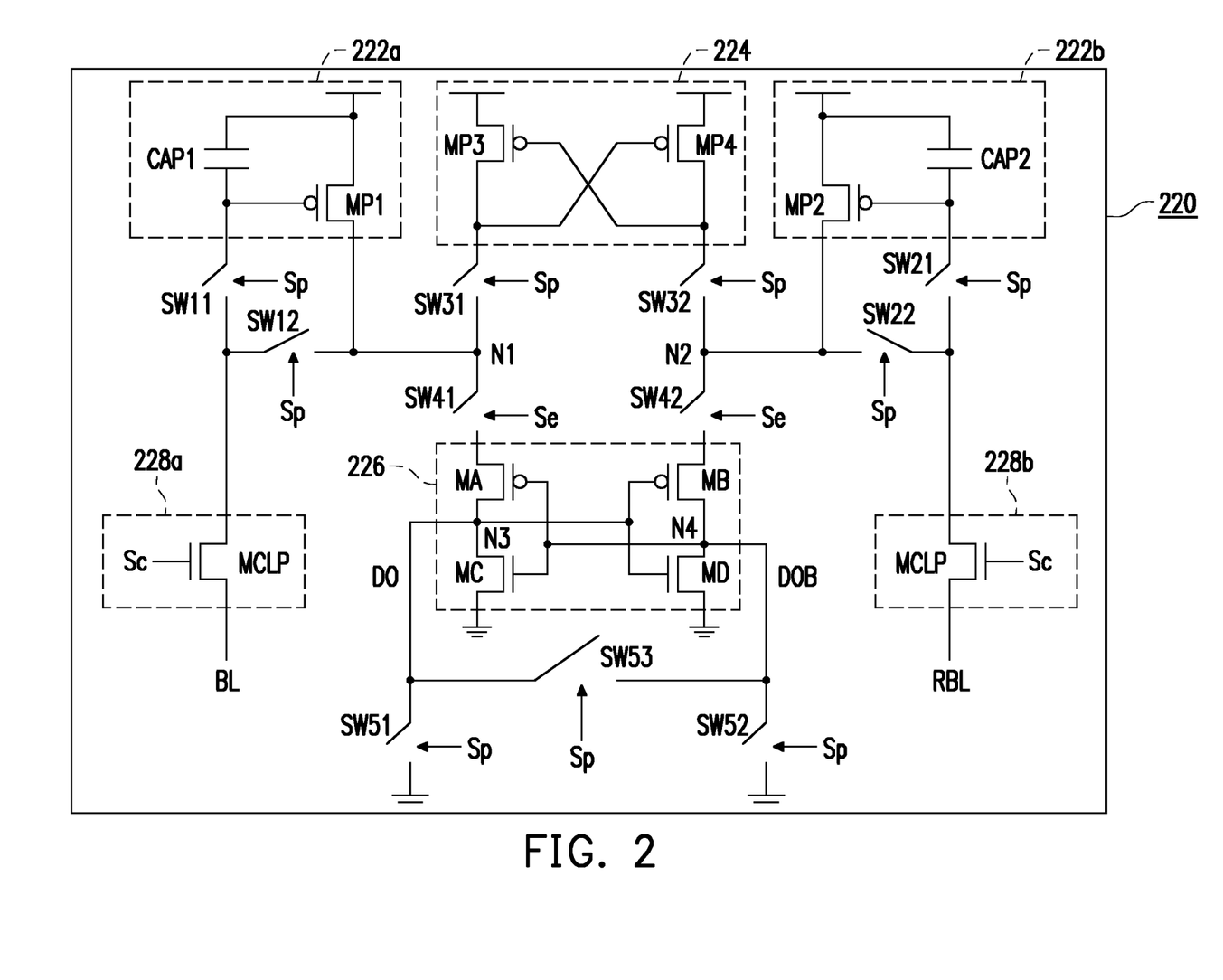
FIG. 2 illustrates a schematic diagram of a sense amplifier according to an embodiment of the present disclosure.

Referring to FIG. 2, a sense amplifier 220 includes a first sample and hold circuit 222a, a second sample and hold circuit 222b, a feedback circuit 224 and a latch-type amplifier 226. The first sample and hold circuits 222a is coupled to a bit line BL via first switches SW11 and SW12. The second sample and hold circuit 222b is coupled to a reference bit line RBL via second switches SW21 and SW22. The first switches SW11, SW12 and the second switches SW21, SW22 are controlled by the same control signal Sp.

The first sample and hold circuit 222a includes a capacitor CAP1 and a transistor MP1. A terminal of the capacitor CAP1 is coupled to a connection node between the gate of the transistor MP1 and the switch SW11; and another terminal of the capacitor CAP1 is coupled to the source of the transistor MP1. The capacitor CAP1 is configured to store electric charge corresponding to the memory cell data during a pre-charge phase of a sensing operation and to discharge the stored electric charge during an evaluation phase of the sensing operation.

Similar to the first sample and hold circuit 222a, the second sample and hold circuit 222b includes a capacitor CAP2 and a transistor MP2. A terminal of the capacitor CAP2 is coupled to a connection node between the gate of the transistor MP2 and the switch SW21; and another terminal of the capacitor CAP is coupled to the source of the transistor MP2. The capacitor CAP2 is configured to store electric charge corresponding to the reference cell data during the pre-charge phase of a sensing operation and to discharge the stored electric charge during the evaluation phase of the sensing operation.

The drain of the transistor MP1 is coupled to the first switch SW12; and a connection node between the drain of the transistor MP1 and the first switch SW12 is coupled to a first node N1. The drain of the transistor MP2 is coupled to the second switch SW22; and a connection node between the drain of the transistor MP2 and the second switch SW22 is coupled to the second node N2. The first node N1 is the connection node among the first sample and hold circuit 222a, the feedback circuit 224 and the latch-type amplifier 226. The second node N2 is the connection node among the second sample and hold circuit 222b, the feedback circuit 224 and the latch-type amplifier 226.

The feedback circuit 224 includes transistors MP3 and MP4, where the transistor MP3 is cross-coupled to the transistor MP4. Particularly, the gate of the transistor MP3 is coupled to the drain of the transistor MP4; and the gate of the transistor MP4 is coupled to the drain of the transistor MP3. The sources of transistors MP3 and MP4 are coupled to the power supply voltage (e.g., Vdd). The drain of the transistor MP3 is coupled to the first node N1 via a third transistors SW31 and the drain of the transistor MP4 is coupled to the second node N2 via another third transistor SW32. The third switches SW31 and SW312 are controlled to be switched on or off by the control signal Sp.

The latch-type amplifier 226 includes transistors MA, MB, MC, MD that form a first inverter and a second inverter. The first inverter is formed by transistors MA and MC, and the second inverter is formed by transistors MB and MD. The first inverter is cross-coupled to the second inverter, where an output of the first inverter is coupled to the input of the second inverter, and the output of the second transistor is coupled to the input of the first inverter. The gates of the transistors MA and MC are coupled to the output node N4 which is a connection node between the drain of the transistor MB and the drain of the transistor MD. The gates of the transistors MB and MD are coupled to an output node N3 which is a connection node between the drain of the transistor MA and the drain of the transistor MC. The source of transistor MA is coupled to the first node N1 via a fourth switch SW41, and the source of the transistor MB is coupled to the second node N2 via another fourth switch transistor SW42. The source of the transistor MC and the source of the transistor MD are coupled to ground. The forth switches SW4 is controlled to be switched on or off by a control signal Se which is different from the control signal Sp. The output node N3 outputs a sensing signal DO of the sense amplifier 220, and the output N4 outputs sensing signal DOB. The sensing signal DO is an inverted signal of the sensing signal DOB.

The sense amplifier 220 may include fifth switches SW51, SW52 and SW53. The switch SW51 is coupled between the output node N3 and the ground; the switch SW52 is coupled between the output node N4 and the ground; and the switch SW53 is coupled between the output node N3 and the output node N4. The fifth switches SW51, SW52 and SW53 are controlled to be switched on or off by the control signal Sp.

In an embodiment of the present disclosure, the sense amplifier 220 further includes a first clamping circuit 228a and a second clamping circuit 228b. The first clamping circuit 228a is coupled between the bit line BL and the first switches SW11 and the switch SW12. The second clamping circuit 228b is coupled between the reference bit line RBL and the second switches SW21 and the switch SW22.

Figure 3:
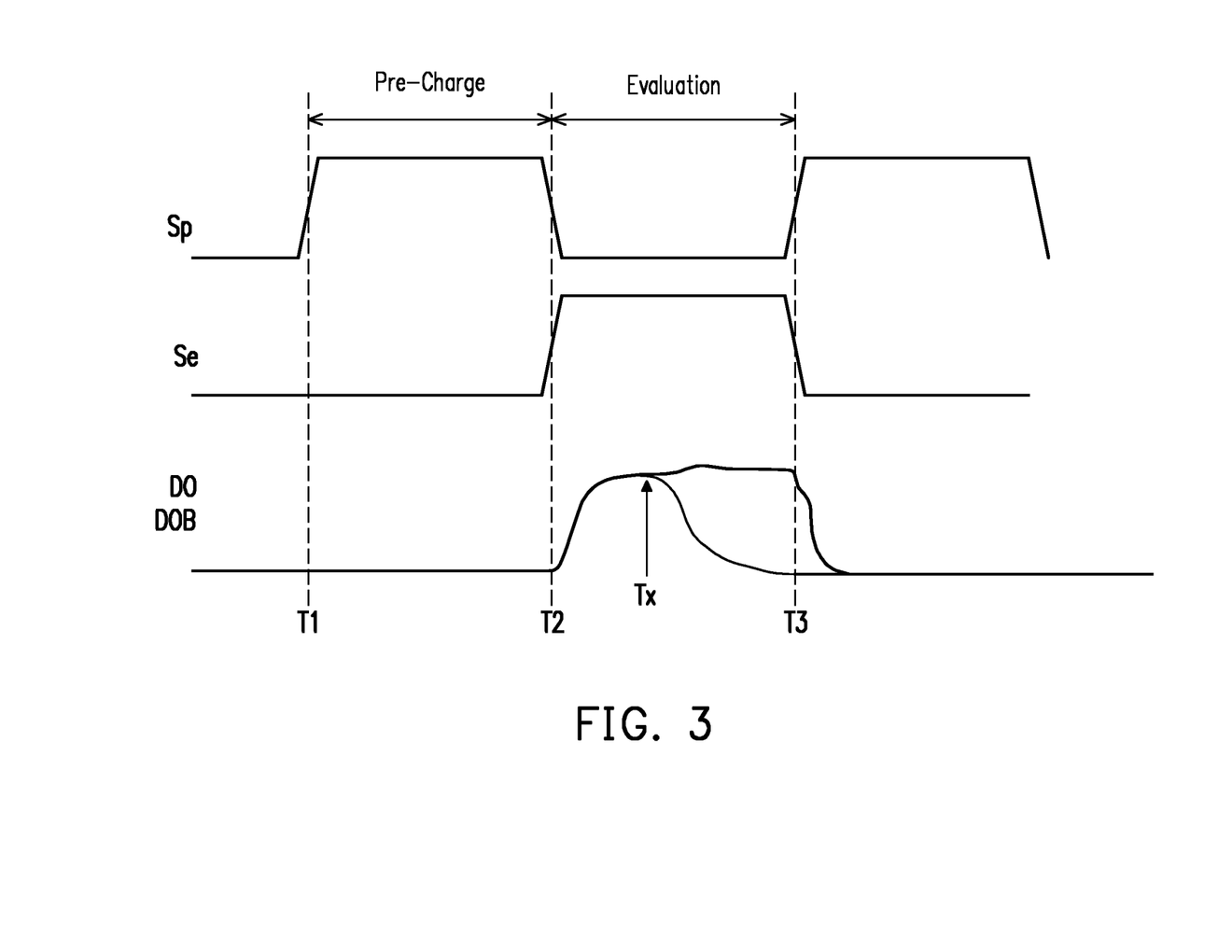
FIG. 3 illustrates a waveform diagram of signals in a sense amplifier according to an embodiment of the present disclosure.

Referring to the waveform diagram illustrated in FIG. 3, a sensing operation may include a pre-charge phase and an evaluation phase. The pre-charge phase is from a time point T1 to a time point T2 in the FIG. 3, and the evaluation phase is from the time point T2 to the time point T3. The control signal Sp is at a high logic level (e.g., logic 1) during the pre-charge phase and is at a low logic level (e.g., logic 0) during the evaluation phase. By contrast, the control signal Se is at the low logic level during the pre-charge phase and is at the high logic level during the evaluation phase. The sensing signals DO and DOB are grounded during the pre-charge phase, and are outputted as the output sensing signals in the evaluation phase. In the first period from T2 to Tx of the evaluation phase, both of the sensing signals DO and DOB are increased from the ground level. In a second period from Tx to T3 of the evaluation phase, the sensing signals DO and DOB are gradually changed to be the inverted signal of each other.

Referring to FIG. 2 and FIG. 3, during the pre-charge phase, the control signal Sp is at the high logic level and the control signal Se is at the low logic level. Accordingly, the first switches SW11 and SW12, the second switches SW21 and SW22, the third switches SW31 and SW33 and the fifth switches SW51, SW52 and SW53 are switched on, and the fourth switches SW41 and SW42 are switched off. During the evaluation phase, the control signal Sp is at the low logic level and the control signal Se is at the high logic level. Accordingly, the first switches SW11 and SW12, the second switches SW21 and SW22, the third switches SW31 and SW33 and the fifth switches SW51, SW52 and SW53 are switched off, and the fourth switches SW41 and SW42 are switched on.

When the first switches SW11 and SW12 are switched on, the first sample and hold circuit 222a is coupled to the bit line BL via the first switches SW11 and SW12. The first sample and hold circuit 222a samples and holds the data of the memory cell coupled to the bit line BL using the capacitor CAP1 and the transistor MP1. When the switches SW11 and SW12 are switched off, the capacitor CAP1 of the first sample and hold circuit 222a discharges the stored electric charge to the latch-type amplifier circuit 226.

When the second switches SW21 and SW22 are switched on, the second sample and hold circuit 222b is coupled to the reference bit line RBL via the second switches SW21 and SW22. The second sample and hold circuit 222b samples and holds the data of the reference memory cell coupled to the reference bit line BL using the capacitor CAP2 and the transistor MP2. When the switches SW21 and SW22 are switched off, the capacitor CAP2 of the second sample and hold circuit 222b discharges the stored electric charge to the latch-type amplifier circuit 226.

When the third switches SW31 and SW32 are switched on, the feedback circuit 224 provides currents to the first node N1 and the second node N2, thereby increase a sensing margin ΔI of the sensing operation. When the third switches SW31 and SW32 are switched off, the feedback circuit is isolated from the first and second node N1 and N2.

When the fourth switches SW41 and SW42 are switched off and the fifth switches SW51, SW52 and SW53 are switched on during the pre-charge phase, the output nodes N3 and N4 are grounded and the latch-type amplifier 226 does not perform a latch operation. Since the output nodes N3 and N4 are grounded, the sensing signals DO and DOB in FIG. 3 are at the low logic level. When the fourth switches SW41 and SW42 are switched on and the fifth switches SW51, SW52 and SW53 are switched off during the evaluation phase, the latch-type amplifier 226 receives the electric charge from the first sample and hold circuit 222a and the electric charge from the second sample and hold circuit 222b. As a result, both of signals DO and DOB increase from ground level to the high logic level during the first period (from T2 to Tx) of the evaluation phase. Next, the signals DO and DOB start to depart from each other as a result of a latching operation of the latch-type amplifier 226. The sensing signals of the sense amplifier 220 may be obtained at the end of the evaluation phase.

Figure 4:
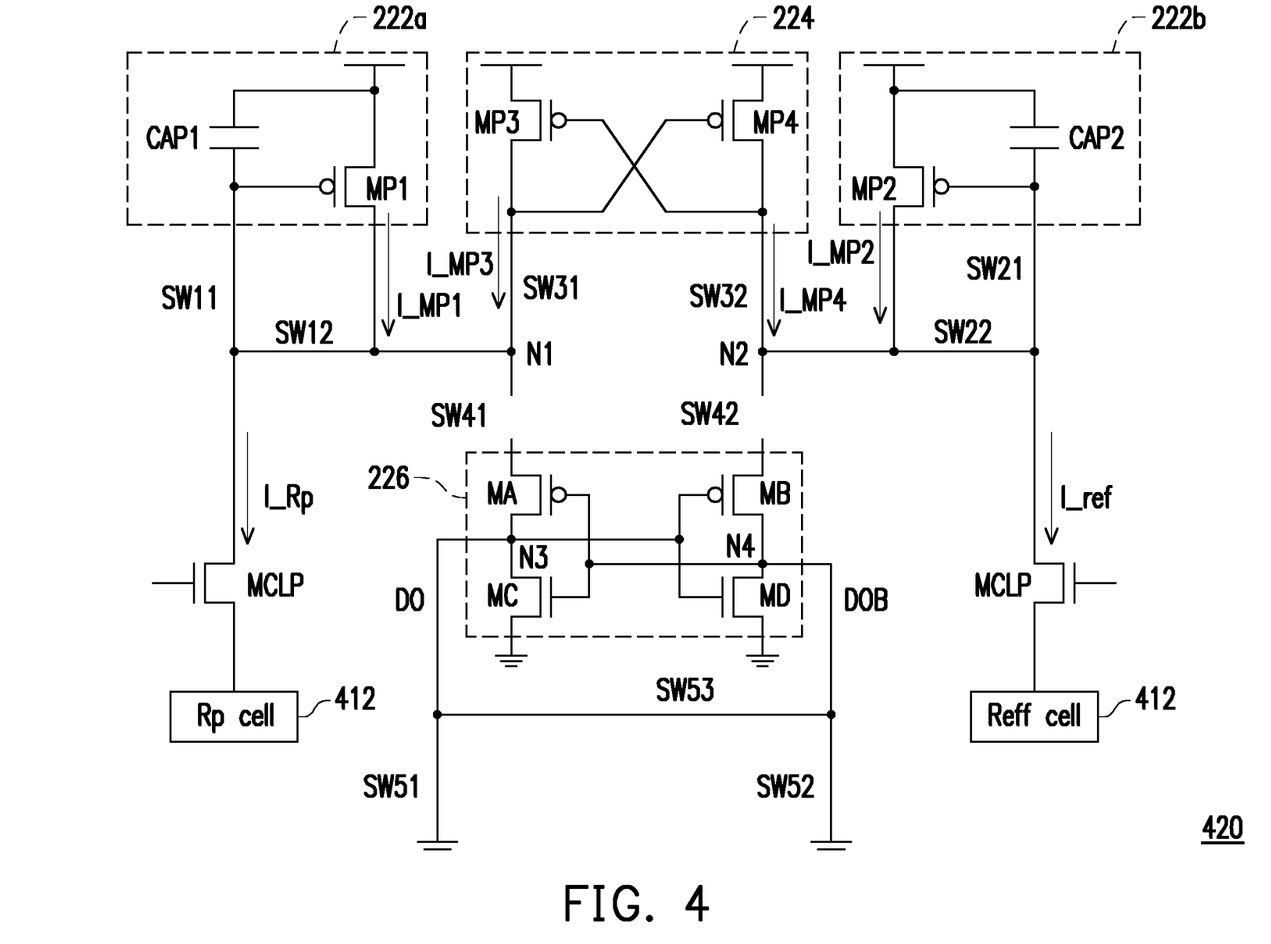
FIG. 4 illustrate an example of a sense amplifier during a pre-charge phase according to an embodiment of the present application.

FIG. 4 illustrates an example of the sense amplifier 420 during a pre-charge phase according to an embodiment of the preset disclosure. The structure of the sense amplifier 420 is similar to the structure of the sense amplifier 220, thus the detailed description of the amplifier 420 is omitted hereinafter. The sense amplifier 420 is configured to sense and compare the currents of a memory cell 412 and a reference memory cell 414. The current flowing through the bit line BL which is coupled to the memory cell 412 is I_Rb and the current flowing through the reference bit line RBL which is coupled to the reference memory cell 414 is I_ref.

During the pre-charge phase of the sensing operation, currents I_MP1, I_MP2, I_MP3 and I_MP4 flow through the transistor MP1, MP2, MP3 and MP4, respectively. The sum of the currents I_MP1 and I_MP3 is equal to the current I_Rp, and the sum of the currents I_MP2 and I_MP4 is equal to the current I_ref. The capacitor CAP1 of the first sample and hold circuit 222a stores electric charge corresponding to the current I_MP1 which is equal to (I_Rp−I_MP3). The capacitor CAP2 of the second sample and hold circuit 222b stores electric charge corresponding to the current I_MP2 which is equal to (I_ref−I_MP3). A sensing margin $\Delta$ I for the sensing operation is $\Delta$ I=I_MP1−I_MP2.

If the feedback circuit 224 is not used in the sense amplifier 420, the current I_MP3 and I_MP4 do not existed, and the current I_MP1 is equal to the current I_Rp and the current I_MP2 is equal to the current I_ref. The sensing margin for the sensing operation is $\Delta$I_0=I_Rp−I_Ref. The sensing margin $\Delta$I of the sense amplifier with the feedback circuit 224 is greater than the sensing margin $\Delta$I_0 of the sense amplifier without the feedback circuit 224. As an example, if the current I_Rp=29.8 uA is flowing in the bit line BL and the current I_ref=29.03 uA is flowing in the reference bit line RBL, the sensing margin of the sense amplifier without the feedback circuit 224 is $\Delta$I_0=I_Rp−I_Ref=29.8-29.03=0.77 uA. On the other hand, if the feedback circuit is used, the current I_MP1, I_MP2, I_MP3 and I_MP3 are 22.6 uA, 21.4 uA, 7.2 uA and 7.63 uA, respectively. The sensing margin $\Delta$I of the sense amplifier with the feedback circuit is $\Delta$I=I_MP1−I_MP2=22.6-21.4=1.2 uA which is greater than the $\Delta$I_0 (0.77 uA). As such, the sensing margin of the sense amplifier may be increased by using the feedback circuit.

Figure 5:
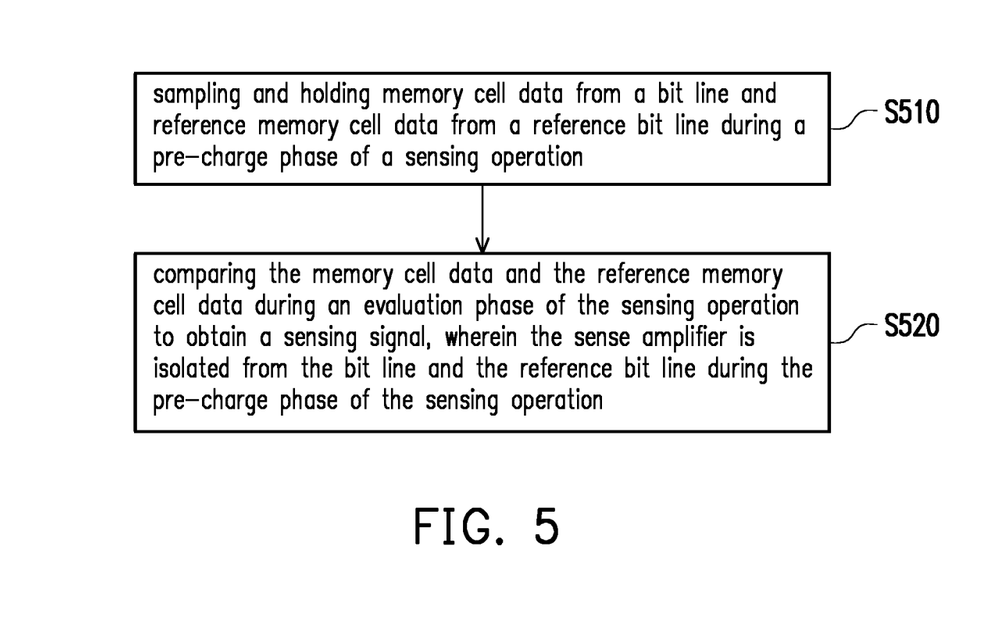
FIG. 5 illustrates a flowchart diagram of a sensing method according to an embodiment of the present disclosure.

Referring to FIG. 5, a sensing method according to an embodiment of the present disclosure is illustrated. In step S510, the memory cell data from a bit line and reference memory cell data from a reference bit line are sampled and hold during a pre-charge phase of a sensing operation. In step S520, the memory cell data and the reference memory cell data are compared during an evaluation phase of the sensing operation to obtain a sensing signal, wherein the sense amplifier is isolated from the bit line and the reference bit line during the pre-charge phase of the sensing operation.

In accordance with some embodiments of the disclosure, a sense amplifier includes a first sample and hold circuit, a second sample and hold circuit, a latch-type amplifier. The first sample and hold circuit is coupled to a bit line and configured to sample and hold memory cell data during a pre-charge phase of a sensing operation. The second sample and hold circuit is coupled to a reference bit line and configured to sample and hold data of a reference memory cell data during the pre-charge phase of the sensing operation. The latch-type amplifier, coupled to the first sample and hold circuit and the second sample and hold circuit, and configured to compare the memory cell data and the reference cell data during an evaluation phase of the sensing operation to output a sensing signal. The sense amplifier is isolated from the bit line and the reference bit line during the evaluation phase of the sensing operation. Since the sense amplifier is isolated from the bit line and the reference bit line during the evaluation phase, the load on the bit line and the reference bit line cannot impact the operation of the sense amplifier during the evaluation phase. As a result, the sensing operation is performed faster and the power consumption is reduced. In accordance with some embodiments of the disclosures, a feedback circuit is included in the sense amplifier, and the feedback circuit is configured to increase the sensing margin of the sense operation.

In accordance with some embodiments of the disclosure, a sensing method of a sense amplifier includes steps of sampling and holding memory cell data from a bit line and reference memory cell data from a reference bit line during a pre-charge phase of a sensing operation and comparing the memory cell data and the reference memory cell data during an evaluation phase of the sensing operation to obtain a sensing signal, wherein the sense amplifier is isolated from the bit line and the reference bit line during the pre-charge phase of the sensing operation.

In accordance with some embodiments of the disclosure, a non-volatile memory includes a memory array and a sense amplifier. The memory array comprises a plurality of memory cells and at least one reference memory cell. The sense amplifier is coupled to the memory array and includes a first sample and hold circuit, a second sample and hold circuit, a latch-type amplifier. The first sample and hold circuit is coupled to a bit line and configured to sample and hold memory cell data during a pre-charge phase of a sensing operation. The second sample and hold circuit is coupled to a reference bit line and configured to sample and hold data of a reference memory cell data during the pre-charge phase of the sensing operation. The latch-type amplifier, coupled to the first sample and hold circuit and the second sample and hold circuit, and configured to compare the memory cell data and the reference cell data during an evaluation phase of the sensing operation to output a sensing signal. The sense amplifier is isolated from the bit line and the reference bit line during the evaluation phase of the sensing operation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A sense amplifier, comprising:
 a first sample and hold circuit, coupled to a bit line and configured to sample and hold memory cell data during a pre-charge phase of a sensing operation;
 a second sample and hold circuit, coupled to a reference bit line, and configured to sample and hold data of a reference memory cell data during the pre-charge phase of the sensing operation; and a latch-type amplifier, coupled to the first sample and hold circuit and the second sample and hold circuit, and configured to compare the memory cell data and the reference cell data during an evaluation phase of the sensing operation to output a sensing signal,
wherein the sense amplifier is isolated from the bit line and the reference bit line during the evaluation phase of the sensing operation.

2. The sense amplifier of claim 1, further comprising:
at least one first switch, coupled between the bit line and the first sample and hold circuit,
wherein the at least one first switch is switched on to electrically couple the bit line to the first sample and hold circuit during the pre-charge phase of the sensing operation, and the at least one first switch is switched off to electrically isolate the bit line from the first sample and hold circuit during the evaluation phase of the sensing operation.

3. The sense amplifier of claim 2, further comprising:
at least one second switch, coupled between the reference bit line and the second sample and hold circuit,
wherein the at least one second switch is switched on to electrically couple the reference bit line to the second sample and hold circuit during the pre-charge phase of the sensing operation, and the at least one second switch is switched off to electrically isolate the reference bit line from the second sample and hold circuit during the evaluation phase of the sensing operation.

4. The sense amplifier of claim 1, further comprising:
a feedback circuit;
a first node, coupled the first sample and hold circuit with the feedback circuit and the latch-type amplifier; and
a second node, coupled the second sample and hold circuit with the feedback circuit and the latch-type amplifier.

5. The sense amplifier of claim 4, further comprising:
a plurality of third switches; and
a plurality of fourth switches,
wherein the feedback circuit is coupled to the first node via one of the third switches and coupled to the second node via another one of the third switches, and
the latch-type amplifier is coupled to the first node via one of the fourth switches and the latch-type amplifier is coupled to the second node via another one of the fourth switches.

6. The sense amplifier of claim 5, wherein
the third witches are switched on to electrically couple the feedback circuit to the first node and the second node during the pre-charge phase of the sensing operation, and the third switches are switch off to electrically isolate the feedback circuit from the first node and the second node during the evaluation phase of the sensing operation, and
the fourth switches are switched off to electrically isolate the latch-type amplifier from the first node and the second node during the pre-charge phase of the sensing operation, and the fourth switches are switched on to electrically couple the latch-type amplifier to the first node and the second node during the evaluation phase of the sensing operation.

7. The sense amplifier of claim 5, wherein the feedback circuit comprises:
a first transistor, having a first terminal, a second terminal and a control terminal; and
a second transistor, having a first terminal, a second terminal and a control terminal, wherein
the control terminal of the first transistor is coupled to a connection node between the second terminal of the second transistor and the another one of the third switches,
the control terminal of the second transistor is coupled to a connection node between the second terminal of the first transistor and the one of the third switches, and
the first terminal of the first transistor and the first terminal of the second transistor is coupled to receive a first reference voltage.

8. The sense amplifier of claim 1, wherein each of the first sample and hold circuit and the second sample and hold circuit comprises:
a transistor, having a first terminal, a second terminal and a control terminal; and
a capacitor, coupled to the transistor,
wherein a first terminal of the capacitor is coupled to a first terminal of the transistor, a second terminal of the capacitor is coupled to a connection node between the control terminal of the transistor and the at least one of the first switch.

9. The sense amplifier of claim 1, wherein the latch-type amplifier comprises:
a first p-type transistor, a second p-type transistor, a first n-type transistor and a second n-type transistor,
wherein the first p-type transistor is coupled to the first n-type transistor to form a first inverter, the second p-type transistor is coupled to the second n-type transistor to form a second inverter, the first inverter is cross-coupled to the second inverter, and outputs of the first inverter and the second inverter are coupled to output terminals of the sense amplifier.

10. The sense amplifier of claim 9, further comprises:
at least one fifth switch, coupled between the latch-type amplifier and a second reference voltage, wherein the at least one fifth switch is switched on to electrically couple the output terminals of the sense amplifier to the second reference voltage during the pre-charge phase of the sensing operation, and the at least one fifth switch is switched off to electrically isolate the output terminals of the sense amplifier from the second reference voltage during the evaluation phase of the sensing operation.

11. The sense amplifier of claim 1, further comprising:
a first clamping circuit, coupled between the bit line and the at least one first switch; and
a second clamping circuit, coupled between the reference bit line and the at least one second switch.

12. A sensing method adapted to a sense amplifier, comprising:
sampling and holding memory cell data from a bit line and reference memory cell data from a reference bit line during a pre-charge phase of a sensing operation; and
comparing the memory cell data and the reference memory cell data during an evaluation phase of the sensing operation to obtain a sensing signal,
wherein the sense amplifier is isolated from the bit line and the reference bit line during the pre-charge phase of the sensing operation.

13. The sensing method of claim 12, wherein
the sensing amplifier comprises a first sample and hold circuit and at least one first switch, and the sensing method further comprises:

switching on the at least one first switch to electrically couple the bit line to the first sample and hold circuit during the pre-charge phase of the sensing operation; and switching off the at least one first switch to electrically isolate the bit line from the first sample and hold circuit during the evaluation phase of the sensing operation.

14. The sensing method of claim 13, wherein
the sensing amplifier further comprises a second sample and hold circuit and at least one second switch, and the sensing method further comprises:
switching on the at least one second switch to electrically couple the reference bit line to the second sample and hold circuit during the pre-charge phase of the sensing operation, and
switching off the at least one second switch to electrically isolate the reference bit line from the second sample and hold circuit during the evaluation phase of the sensing operation.

15. The sensing method of claim 12, wherein the sense amplifier comprises a feedback circuit, a first node, a second node and a plurality of third switches, and the sensing method further comprises:
switching on the third switches to electrically couple the feedback circuit to the first node and the second node during the pre-charge phase of the sensing operation; and
switching off the third switches to electrically isolate the feedback circuit from the first node and the second node during the evaluation phase of the sensing operation.

16. The sensing method of claim 15, wherein the sense amplifier further comprises a latch-type amplifier, and a plurality of fourth switches, and the sensing method further comprises:
switching on the fourth switches to electrically couple the latch-type amplifier to the first node and the second node during the pre-charge phase of the sensing operation; and
switching off the fourth switches to electrically isolate the latch-type amplifier from the first node and the second node during the evaluation phase of the sensing operation.

17. The sensing method of claim 16, wherein the latch-type amplifier comprises a first inverter and a second inverter, the first inverter is cross-coupled to a second inverter, and the sensing method further comprises:
outputting the sensing signal at the output terminals of the first inverter and the second inverter.

18. The sensing method of claim 17, wherein the output terminals of the first inverter and the second inverter are discharged to a reference voltage level during the pre-charge phase of the sensing operation.

19. The sensing method of claim 17, wherein the sense amplifier further comprising at least one fifth switch, and the method further comprises:
switching on the at least one fifth switch to electrically couple the latch-type amplifier to a reference voltage during the pre-charge phase of the sensing operation; and
switching off the at least one fifth switch to electrically isolate the latch-type amplifier from the reference voltage during the evaluation phase of the sensing operation.

20. A non-volatile memory, comprising:
a memory array, comprising a plurality of memory cells and at least one reference memory cell;
a sense amplifier, coupled to the memory array, comprising:
a first sample and hold circuit, coupled to a bit line and configured to sample and hold memory cell data of one of the memory cells during a pre-charge phase of a sensing operation;
a second sample and hold circuit, coupled to a reference bit line, and configured to sample and hold data of a reference memory cell data of the at least one reference memory cell during the pre-charge phase of the sensing operation;
a latch-type amplifier, coupled to the first sample and hold circuit and the second sample and hold circuit, and configured to compare the memory cell data and the reference cell data during an evaluation phase of the sensing operation to output a sensing signal,
wherein the sense amplifier is isolated from the bit line and the reference bit line during the evaluation phase of the sensing operation.

* * * * *